(12) United States Patent
Willmeroth et al.

(10) Patent No.: US 9,825,127 B2
(45) Date of Patent: *Nov. 21, 2017

(54) SUPER JUNCTION SEMICONDUCTOR DEVICE WITH FIELD EXTENSION ZONES

(71) Applicant: Infineon Technologies Austria AG, Villach (AT)

(72) Inventors: Armin Willmeroth, Augsburg (DE); Franz Hirler, Isen (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/088,914

(22) Filed: Apr. 1, 2016

(65) Prior Publication Data

US 2016/0218174 A1 Jul. 28, 2016

Related U.S. Application Data

(63) Continuation of application No. 13/769,612, filed on Feb. 18, 2013, now Pat. No. 9,318,549.

(51) Int. Cl.
*H01L 29/06* (2006.01)
*H01L 29/78* (2006.01)
(Continued)

(52) U.S. Cl.
CPC ...... *H01L 29/0634* (2013.01); *H01L 29/1095* (2013.01); *H01L 29/7802* (2013.01);
(Continued)

(58) Field of Classification Search
None
See application file for complete search history.

(56) References Cited

U.S. PATENT DOCUMENTS 6,081,009 A * 6/2000 Neilson ............... H01L 29/0623
257/341
6,271,562 B1 * 8/2001 Deboy ................. H01L 29/0634
257/328

(Continued)

FOREIGN PATENT DOCUMENTS

| CN | 101924132 A | 12/2010 |
|---|---|---|
| CN | 102169902 A | 8/2011 |
| CN | 202042487 U | 11/2011 |
| DE | 19840032 C1 | 11/1999 |
| DE | 10120656 A1 | 10/2002 |
| DE | 102008039845 A1 | 3/2009 |

*Primary Examiner* — Bilkis Jahan
(74) *Attorney, Agent, or Firm* — Murphy, Bilak & Homiller, PLLC

(57) ABSTRACT

A super junction semiconductor device includes an impurity layer of a first (conductivity) type formed in a semiconductor portion having first and second parallel surfaces, a super junction structure between the first surface and impurity layer and including first columns of the first type and second columns of a second (conductivity) type, a body zone of the second type formed between the first surface and one of the second columns at least partially in the vertical projection of the second columns, and a field extension zone of the second type electrically connected to the body zone and arranged in the vertical projection of one of the columns. An area impurity density in the field extension zone is between $1 \times 10^{12}$ and $5 \times 10^{12}$ cm$^{-2}$. A mean net impurity concentration in the field extension zone is higher than in the second columns and lower than in the body zone.

21 Claims, 14 Drawing Sheets

(51) Int. Cl.
*H01L 29/10* (2006.01)
*H01L 29/08* (2006.01)

(52) U.S. Cl.
CPC ...... *H01L 29/7811* (2013.01); *H01L 29/7813* (2013.01); *H01L 29/0649* (2013.01); *H01L 29/0653* (2013.01); *H01L 29/0878* (2013.01)

(56) References Cited

U.S. PATENT DOCUMENTS

| | | | |
|---|---|---|---|
| 6,291,856 B1* | 9/2001 | Miyasaka | H01L 29/0634 257/335 |
| 6,472,678 B1* | 10/2002 | Hshieh | H01L 29/7813 257/3 |
| 6,551,909 B1 | 4/2003 | Fujihira | |
| 6,611,021 B1 | 8/2003 | Onishi et al. | |
| 7,405,452 B2* | 7/2008 | Yilmaz | H01L 29/0619 257/135 |
| 7,868,384 B2 | 1/2011 | Lee et al. | |
| 7,936,010 B2 | 5/2011 | Zundel et al. | |
| 8,084,811 B2 | 12/2011 | Disney et al. | |
| 9,318,549 B2* | 4/2016 | Willmeroth | H01L 29/0634 |
| 2002/0088990 A1 | 7/2002 | Iwamoto et al. | |
| 2006/0197152 A1 | 9/2006 | Tokano et al. | |
| 2007/0238271 A1 | 10/2007 | Yamauchi et al. | |
| 2008/0246084 A1 | 10/2008 | Ono et al. | |
| 2009/0273031 A1 | 11/2009 | Saito et al. | |
| 2010/0136774 A1 | 6/2010 | Schulze et al. | |

* cited by examiner

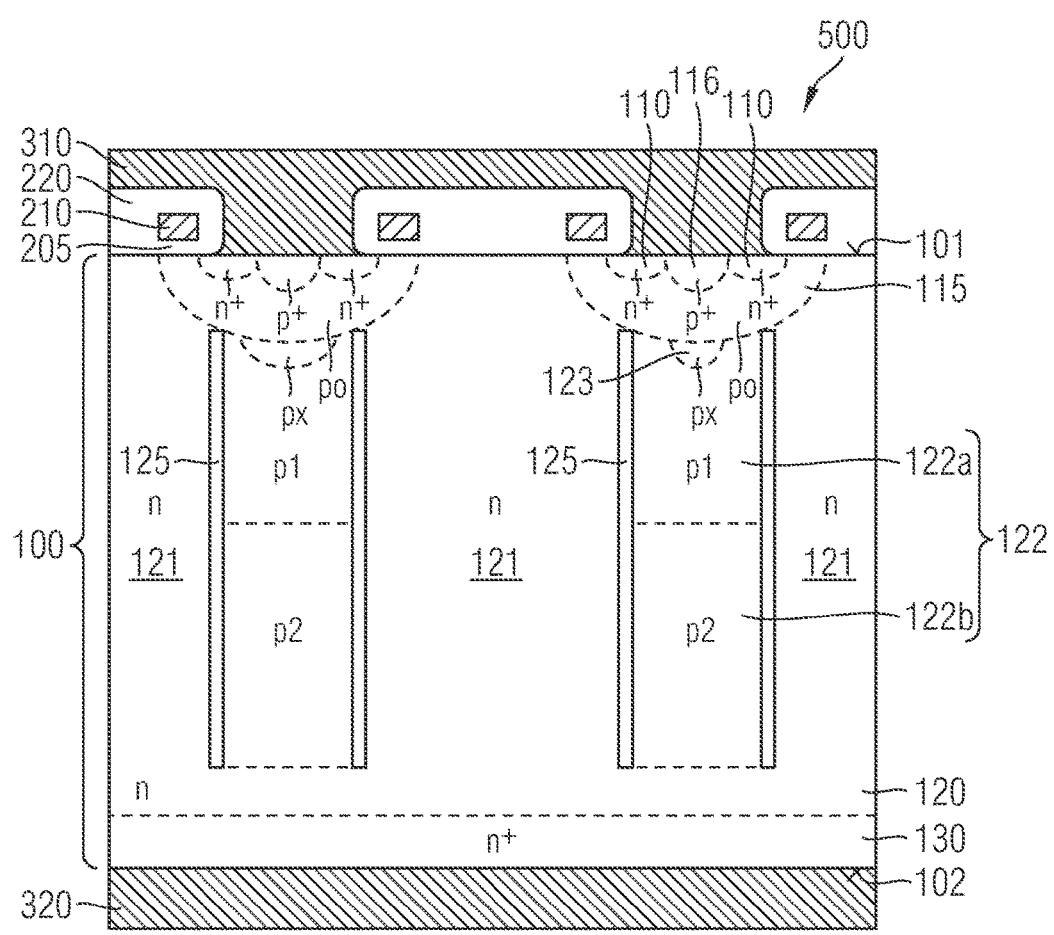

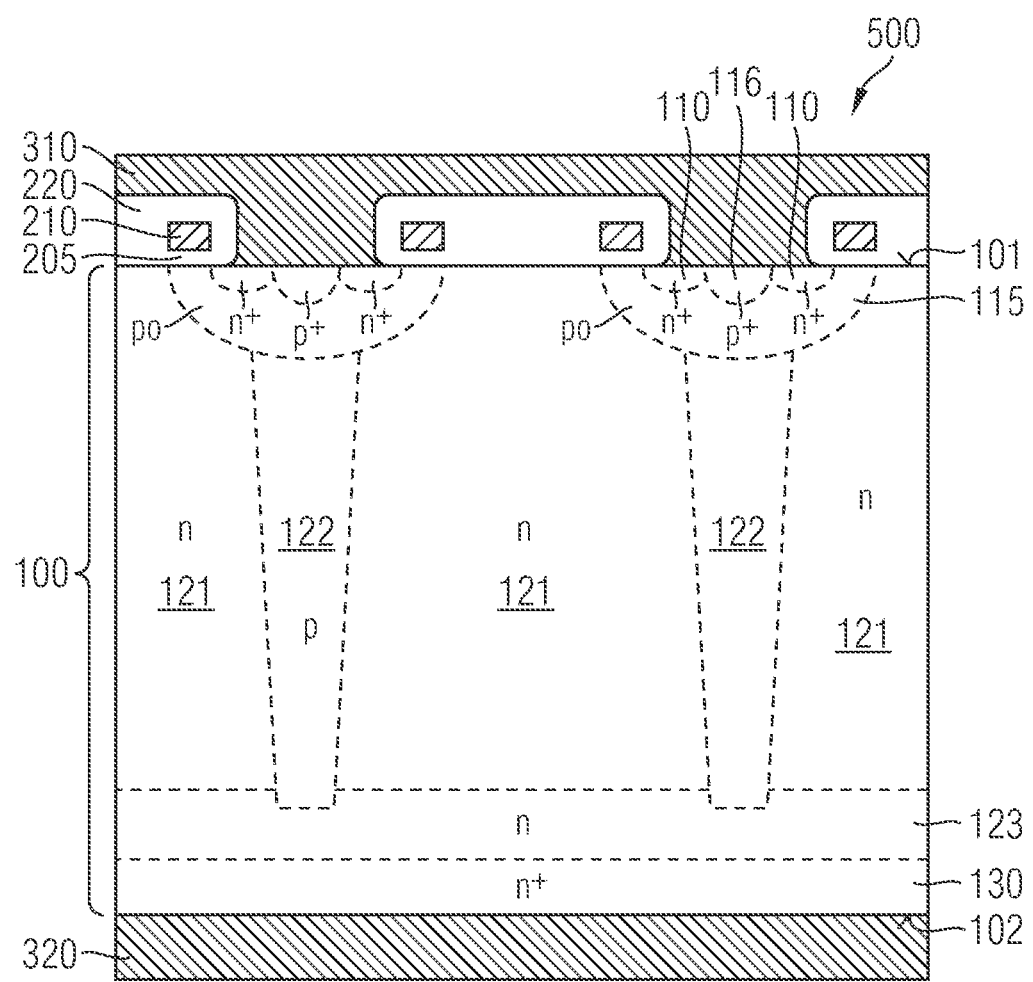

US 9,825,127 B2

SUPER JUNCTION SEMICONDUCTOR DEVICE WITH FIELD EXTENSION ZONES

BACKGROUND

A semiconductor portion of a super junction n-FET (field effect transistor) includes an n-type drain layer and a drift layer with p-doped columns separated by n-doped columns. In the reverse mode, depletion zones extend between the p-doped and n-doped columns in a lateral direction such that a high reverse breakdown voltage can be achieved even at a high impurity concentration in the n-doped columns. The vertical impurity distribution in the p-doped and/or the n-doped columns may vary with the distance to the drain layer such that device characteristics are improved in case an avalanche effect is triggered. It is desirable to further improve the avalanche characteristics of super junction semiconductor devices without unduly adversely affecting the on-state characteristics.

SUMMARY

According to an embodiment, a super junction semiconductor device includes a semiconductor portion with a first surface and a second surface parallel to the first surface. An impurity layer of a first conductivity type and a super junction structure are formed in the semiconductor portion. The super junction structure includes first columns of the first conductivity type and second columns of a second, opposite conductivity between the first surface and the impurity layer. A sign of a compensation rate between the first and second columns changes along a vertical extension of the columns perpendicular to the first surface. A body zone of the second conductivity type is formed between the first surface and one of the second columns. A field extension zone of the second conductivity type arranged in the vertical projection of one of the first or the second columns is electrically connected to the body zone. An area impurity density in the field extension zone is between $1 \times 10^{12}$ and $5 \times 10^{12}$ cm$^{-2}$.

According to another embodiment, a super junction semiconductor device includes an impurity layer of a first conductivity type formed in a semiconductor portion having a first surface and a second surface parallel to the first surface. Between the first surface and the impurity layer is a super junction structure that includes first columns of the first conductivity type and second columns of an opposite second conductivity type. A sign of a compensation rate between the first and second columns changes along a vertical extension of the columns perpendicular to the first surface. A body zone of the second conductivity type is formed between the first surface and one of the second columns. At least one field extension zone of the first conductivity type is electrically connected to the impurity layer. The at least one field extension zone is arranged in the vertical projection of at least one of the first and second columns.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic cross-sectional view of a portion of a super junction semiconductor device in accordance with an embodiment providing a super junction structure including a dielectric liner and a p-doped field extension zone between a body zone and a p-type column.

FIG. 4C is a schematic cross-sectional view of a portion of a semiconductor device in accordance with an embodiment providing a contiguous field extension zone and tapered p-doped columns.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", an and the are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

Figure 1A:
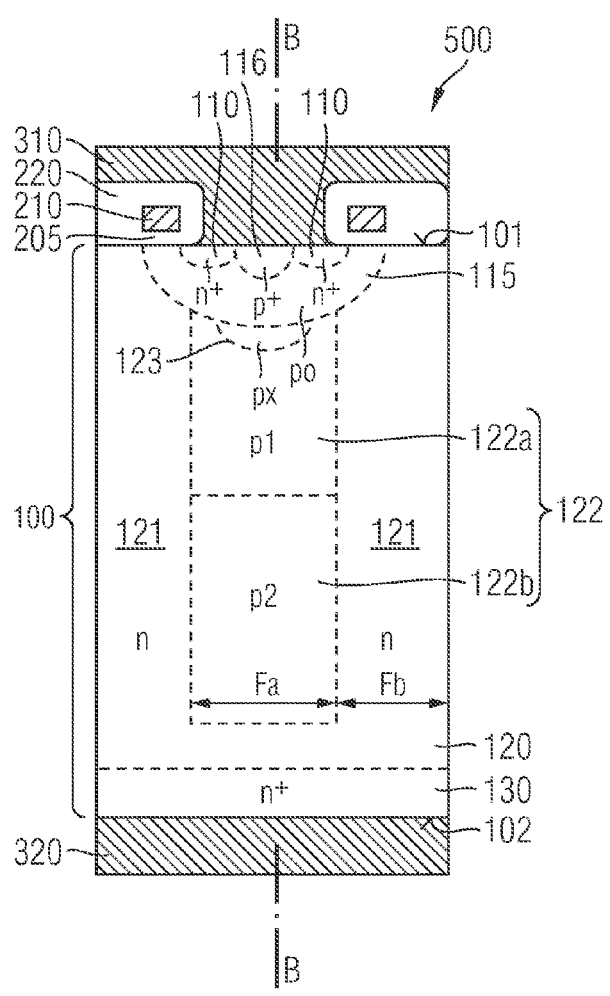
FIG. 1A is a schematic cross-sectional view of a portion of a semiconductor device in accordance with an embodiment providing a p-type field extension zone between the body zone and p-type columns.

FIG. 1A shows a super junction semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is at least 50 μm, for example at least 175 μm. The semiconductor portion 100 may have a rectangular shape with an edge length in the range of several millimeters. The normal to the first and second surfaces 101, 102 defines a vertical direction and directions orthogonal to the normal direction are lateral directions.

The semiconductor portion 100 may include an impurity layer 130 of a first conductivity type. A mean net impurity concentration in the impurity layer 130 is comparatively high and may be at least $5 \times 10^{18}$ cm$^{-3}$, by way of example. The impurity layer 130 may extend along a complete cross-sectional plane of the semiconductor portion 100 parallel to the second surface 102. In case the semiconductor device 500 is an IGFET (insulated gate field effect transistor), the impurity layer 130 directly adjoins the second surface 102. In case the semiconductor device 500 is an IGBT (insulated gate bipolar transistor), a collector layer of a second conductivity type, which is the opposite of the first conductivity type, is arranged between the impurity layer 130 and the second surface 102.

A drift layer 120 is between the first surface 101 and the impurity layer 130. The drift layer 120 includes a super junction structure with first columns 121 of the first conductivity type and second columns 122 of a second conductivity type which is opposite to the first conductivity type. The second columns 122 may directly adjoin the impurity layer 130. According to other embodiments, the second columns 122 are formed at a distance to the impurity layer 130 such that the drift layer 120 includes a contiguous portion of the first conductivity type. The contiguous portion extends between the buried edges of the first and second columns 121, 122 on the one hand and the impurity layer 130 on the other hand. The first and second columns 121, 122 directly adjoin to each other.

The first and second columns 121, 122 may be parallel stripes arranged at regular distances. According to other embodiments, the cross-sections of the second columns 122 parallel to the first surface 101 may be circles, ellipsoids, ovals or rectangles, e.g. squares, with or without rounded corners, and the first columns 121 are segments of a grid embedding the second columns 122.

The semiconductor portion 100 further includes source zones 110 of the first conductivity type and body zones 115 of the second conductivity type, wherein the body zones 115 are structurally and electrically connected to the second columns 122 and structurally separate the source zones 110 and the first columns 121.

The source zones 110 may be exclusively formed within a cell area and may be absent in an edge area surrounding the cell area. The body zones 115 are provided at least in the cell area and may or may not be absent in the edge area.

Gate dielectrics 205 electrically separate gate electrodes 210 and neighboring portions of the body zones 115. A potential applied to the gate electrodes 210 capacitively controls a minority charge carrier distribution in a portion of the body zones 115 adjoining the gate dielectrics 205 between the source zones 110 and the corresponding second columns 122 such that in a conductive or on-state of the semiconductor device 500 an on-state current flows between the source zones 110 and the impurity layer 130 through inversion layers in the body zones 115 and through the drift layer 120.

The gate electrodes 210 may be arranged above the first surface 101. According to other embodiments, the gate electrodes 210 may be buried in trenches extending from the first surface 101 into the semiconductor portion 100.

A first electrode structure 310 may be electrically connected to the source zones 110 and the body zones 115 through openings in a dielectric layer 220 covering the gate electrode structures 210. The openings in the dielectric layer 220 are formed between neighboring gate electrodes 210. Heavily doped contact zones 116 of the second conductivity type may be formed within the body zones 115 in direct contact with the first electrode structure 310 to ensure a low-ohmic contact between the first electrode structure 310 and the body zones 115. The dielectric layer 220 dielectrically insulates the first electrode structure 310 from the gate electrodes 210.

A second electrode structure 320 directly adjoins the second surface 102 of the semiconductor portion 100. According to embodiments related to super junction IGFETs, the second electrode structure 320 directly adjoins the impurity layer 130. According to embodiments related to super junction IGBTs, a collector layer of the second conductivity type may be formed between the impurity layer 130 and the second electrode structure 320.

Each of the first and second electrode structures 310, 320 may consist of or contain, as main constituent(s), aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, at least one of the first and second electrode structures 310, 320 includes two or more sub-layers, each sub-layer containing one or more of Ni, Ti, Ag, Au, Pt, and Pd as main constituent(s), e.g., silicides and/or alloys.

According to the illustrated embodiment, the first conductivity type is the n-type, the second conductivity type is the p-type, the first electrode structure 310 is a source electrode and the second electrode structure 320 is a drain electrode. According to other embodiments, the first conductivity type is the p-type.

The super junction structure has an impurity distribution that varies with the distance to the first surface 101. According to an embodiment, in the super junction structure the sign of a compensation rate changes at least once along a vertical extension of the super junction structure. The compensation rate for a vertical section along the vertical extension of the columns 121, 122 may be defined by the difference between the quantity of impurities of the second conductivity type in the second columns 122 and the quantity of impurities of the first conductivity type in the first columns 121 related to the greater amount of both values. For perfect compensation the quantities related to an arbitrary section of the vertical extension are equal and the compensation rate in this section is equal to 0. With the first conductivity type being the n-type and the second conductivity type being the p-type, the compensation rate is +0.5 when the quantity of p-impurities in a section of the second columns 122 is twice the quantity of n-impurities in a corresponding section of the first columns 121. The compensation rate is −0.5 when the quantity of p-impurities in a vertical section of the second columns 122 is half the quantity of n-impurities in the corresponding section of the first columns 121. For the illustrated embodiment at equal cross-sectional areas of the first and second columns 121, 122 and with p1 >n>p2, the compensation rate for a first section 122a of the second columns 122 oriented to the first surface 101 is (p1−n)/p1 and the compensation rate for a remaining second section 122b oriented to the second surface 102 is (p2−n)/n.

Starting from the vertical pn-junctions between the first and second columns 121, 122, at increasing reverse voltage depletion zones grow in the lateral direction until the super junction structure is completely depleted from mobile charge carriers. In super junction devices with perfect compensation, the charges of the remnant charge carriers in the first and second columns 121, 122 completely compensate each other such that the electric field strength does not change over the complete vertical extension of the super junction structure. Since the integral over the electric field strength between the first and second electrode structures 310, 320 gives the blocking voltage that the semiconductor device can accommodate and since this area is maximized, a high breakdown voltage is achieved.

In super junction devices where the compensation rate changes the sign along the vertical extension of the super junction structure, impurities of the first conductivity type slightly overcompensate for impurities of the second conductivity type in a section oriented to the second surface 102 and impurities of the second conductivity type slightly overcompensate for impurities of the first conductivity type in a remaining section oriented to the first surface 101. The overcompensation may be achieved by varying the impurity concentration exclusively in the first columns 121, exclusively in the second columns 122, or both in the first and second columns 121, 122. Alternatively or in addition, the cross-sectional areas of the columns 121, 122 in the lateral directions parallel to the first surface 101 may be varied.

Within each of the first and second sections 122a, 122b of the second columns 122, the compensation rate may be constant or may decrease strictly or in steps with decreasing distance to the interface where the change of sign takes place.

According to the illustrated embodiment, the lateral cross-sectional areas Fa of the second columns 122 and Fb of the first columns 121 are constant along the vertical extension. First sections 122a of the second columns 122, which are oriented to the first surface 101, have an impurity concentration p1 of p-type impurities such that Fa×p1 exceeds Fb×n, with n being the impurity concentration of n-type impurities in an adjoining section of the first columns 121 at the same distance to the first surface 101. The sign of the compensation rate is positive in a section of the super junction structure oriented to the first surface 101. Second sections 122b of the second columns 122, which are oriented to the second surface 101, have an impurity concentration p2 of p-type impurities such that Fa×p2 is lower than Fb×n in an adjoining section of the first columns 121 at the same distance to the first surface 101. The sign of the compensation rate is negative in a section of the super junction structure oriented to the second surface 102.

A first section of the super junction structure oriented to the first surface 101 and corresponding to the first sections 122a of the second columns 122 has an excess of impurities of the second conductivity type. A remaining second section oriented to the second surface 102 and corresponding to the second sections 122a of the second columns 122 has an excess of impurities of the first conductivity type. Impurities of the second conductivity type predominate in the first section and impurities of the first conductivity type predominate in the second section. As a consequence, the sign of the compensation rate between the first and second columns 121, 122 changes once along the vertical extension of the columns 121, 122. The first and second sections 122a, 122b of the second columns 122 may extend at least over a third of the complete vertical extension, respectively. According to an embodiment, the first sections 122a of the second columns 122 extend over 40% to 60% of the vertical extension of the second columns 122 and the second sections 122b extend over a remaining section of the vertical extension of the respective second columns 122.

In the reverse mode, after depletion of the super junction structure from mobile charge carriers the stationary charges do not compensate each other. As a result, in the super junction structure the electric field strength increases from both ends of the columns 121, 122 and reaches a shallow peak at the interface where the sign of the compensation rate changes.

According to an embodiment, the amount of the compensation rate in both the first and second vertical sections of the super junction structure is at most 0.5. Though with increasing deviation from perfect compensation, i.e. from a compensation rate=0, the blocking voltage that the semiconductor device 500 can accommodate in the reverse mode decreases, a sufficiently high breakthrough voltage can be obtained. The shallow peak of the electric field strength defines the area where mobile charge carriers are generated when an avalanche breakthrough has been triggered. The amount of the compensation rate in both the first and second sections may be at least 0.1 such that a peak range, where the electric field strength is sufficiently high to generate charge carriers in case an avalanche effect has been triggered, is sufficiently small to sufficiently restrict the number of generated charge carriers and to ensure that the voltage across the semiconductor device 500 does not immediately break down.

The resulting electrical field profile (distribution) has a shallow peak approximately in the middle of the vertical extension of the super junction structure. Electrons and holes affect the field distribution both in the breakdown and in the avalanche case. Both types of charge carriers have a stabilizing effect, since both flow from the place of generation into areas in which they compensate for the predominating excess charge of the immobile charge carriers. As a consequence, there is a continuous stability range from p-loaded to n-loaded compensation rates.

Field extension zones 123 are provided in the vertical projection of the second columns 122. The field extension zones 123 have the second conductivity type as the second columns 122. Each field extension zone 123 is electrically connected to both a second column 122 and the body zone 115 assigned to the respective second column 122. Each field extension zone 123 extends from an interface between the respective body zone 115 and the corresponding second column 122 into the first section 122a.

An area impurity density in the field extension zone 123 is defined such that the electric field extends into the field extension zone 123 only at current densities typical for the avalanche mode, whereas the electric field stops at the field extension zone 123 at lower current densities. According to an embodiment, the area impurity density is in the range of the breakdown charge, or slightly above the breakdown charge, e.g., between $1 \times 10^{12}$ and $5 \times 10^{12}$ cm$^{-2}$ in the transistor cells within an active cell area of the semiconductor device. According to an embodiment the area impurity density in the field extension zone 123 is between $2 \times 10^{12}$ and $3 \times 10^{12}$ cm$^{-2}$. At such values, the electric field extends into the field extension zone 123 only at high currents in the avalanche mode, wherein the current in the avalanche mode can be at least 20% of the rated current, equal to the rated current or exceed the rated current by at least 20%.

A vertical extension of the field extension zone 123 may be at least 2 µm, such that the field extension zone 123 provides a sufficiently significant increase of the maximum breakdown voltage. A mean net impurity concentration may then be at most $1 \times 10^{16}$ cm$^{-3}$.

The field extension zone 123 may extend over the whole lateral cross-sectional area of the second column 122. According to the illustrated embodiment, the field extension zone 123 is formed only in a lateral central portion of the corresponding second column 122 and is spaced from all neighboring first columns 121. The field extension zone 123 may be a "bubble" whose vertical extension has a maximum in the lateral centre of the second column 122 and decreases with increasing distance to the center.

In the field extension zone 123 the mean net impurity concentration px is higher than in the first section 122a of the second column 122 and lower than a mean net impurity concentration p0 in the body zone 115. For example, the maximum impurity concentration in the field extension zone 123 is at least two times, for example ten times, the mean net impurity concentration p1 in the first section 122a of the second column 122 and at most half, e.g. a tenth, of the maximum net impurity concentration in the body zone 115. The amount of impurities per unit area may be larger than a breakdown charge amount at a breakdown voltage. The breakdown charge amount is the charge amount that may be depleted by a pn-junction before the avalanche factor 1 is reached. The breakdown charge amount depends on the background impurity concentrations. For example, the breakdown charge amount is between $2 \times 10^{12}$ cm$^{-2}$ and $3 \times 10^{12}$ cm$^{-2}$. According to an embodiment, the vertical extension of the field extension zone is at least 2 micrometers. A mean impurity concentration in the field extension zone 123 may be between $5 \times 10^{15}$ cm$^{-3}$ and $5 \times 10^{16}$ cm$^{-3}$, by way of example.

Figure 1B:
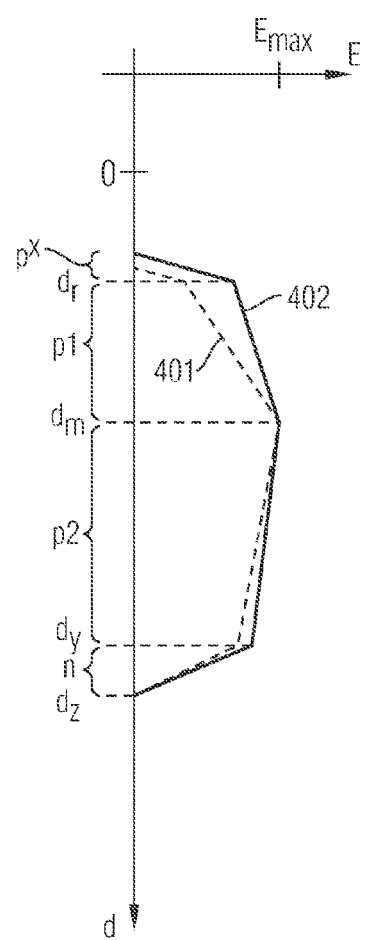
FIG. 1B is a schematic diagram illustrating electric field profiles for the semiconductor device of FIG. 1A along line B-B.

FIG. 1B shows a first electrical field profile 401 of the semiconductor device of FIG. 1A in case a reverse voltage is applied and no avalanche effect has been triggered. In substance, the electric field extends between the heavily doped impurity layer 130 at a distance dz to the first surface 101 and the field extension zone 123. The impurity concentration in the field extension zone 123 is selected such that the electrical field may extend up to a certain distance into the field extension zone 123. For example, the electrical field zone extends up to a third of the vertical extension of the field extension zone 123 at a distance dx to the first surface 101. The electric field strength increases up to the distance dm where the sign of the compensation rate changes and where the electric field strength reaches a maximum value Emax. Beyond dm, the electric field strength decreases to zero at the interface between the drift layer 120 and the impurity layer 130 at the distance dz. The slope of the electric field strength depends on the compensation rate and is high where the compensation rate is high and low where the compensation rate is low.

The impurity concentration in the field extension zone 123 is lower than in the body zone 115 such that once an avalanche mechanism has been triggered, the electric field can propagate deeper into the field extension zone 123 as shown by the second electric field profile 402. By contrast, in a comparative example without field extension zone 123, the electric field is barred from propagating into the comparatively heavily doped body zone 115. Since the area below the electric field profile 402 determines the voltage that can be accommodated by the semiconductor device 500, the field extension zone 123 significantly improves the robustness against avalanche events in the semiconductor device 500. The field extension zone 123 introduces a further degree of freedom for adapting on-state resistance, avalanche characteristics and voltage blocking capability of the semiconductor device 500 to application constraints.

Field extension zones 123 may be provided for super junction structures obtained by various trench approaches providing non-undulated impurity profiles, wherein trenches are introduced into a semiconductor substrate from a direction corresponding to the first surface 101 of a semiconductor portion 100 obtained from the semiconductor substrate and wherein at least one type of columns 121, 122 is formed by filling the trenches or by implanting impurities into the trench sidewalls.

FIG. 2A shows a super junction semiconductor device 500 obtained by etching trenches into a semiconductor substrate including an n-type semiconductor portion 100. A dielectric liner 125 lines at least sidewalls of the etched trenches. The dielectric liner 125 may be provided from a semiconductor oxide, e.g., a thermal oxide of the semiconductor material of the semiconductor portion 100, e.g., silicon oxide, a deposited oxide, or a semiconductor nitride, by way of example. Single-crystalline p-doped semiconductor material may be grown by epitaxy in the trenches to form the second columns 122.

According to an embodiment, the lateral cross-sectional area of the trench does not change with the distance to the first surface 101. A first section 122a of the second column 122 oriented to the first surface 101 of the semiconductor portion 100 may be provided with a higher impurity concentration than a remaining second section 122b oriented to the second surface 102. Each of the first and second sections 122a, 122b may be homogeneously doped. According to other embodiments, the impurity concentration may gradually decrease with increasing distance to the first surface 101. Other embodiments may provide more than one step in the impurity concentration profile.

Figure 2B:
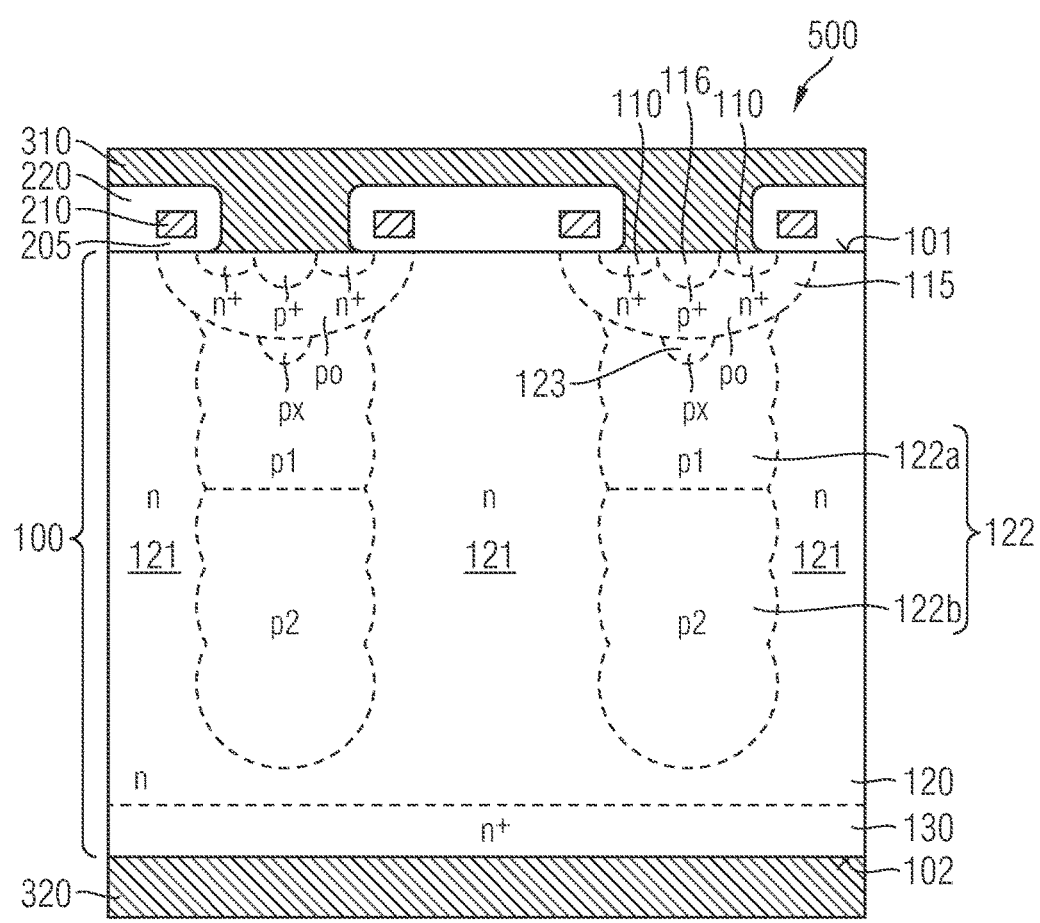
FIG. 2B is a schematic cross-sectional view of a portion of a super junction semiconductor device in accordance with an embodiment providing a super junction structure based on sub-layers grown by epitaxy and a p-doped field extension zone between a body zone and a p-doped column.

FIG. 2B refers to an embodiment providing the first and second columns 121, 122 by repeating a sequence that includes growing a sub-layer by epitaxy and implanting impurities of at least one conductivity type into a surface of the grown sub-layer using implant masks. The super junction structure is obtained by diffusing either the first or the second columns 121, 122 or both out from the implants. As a consequence, the impurity profiles of the first and second columns 121, 122 may be undulated in the vertical and/or lateral direction as indicated in FIG. 2B.

Figure 2C:
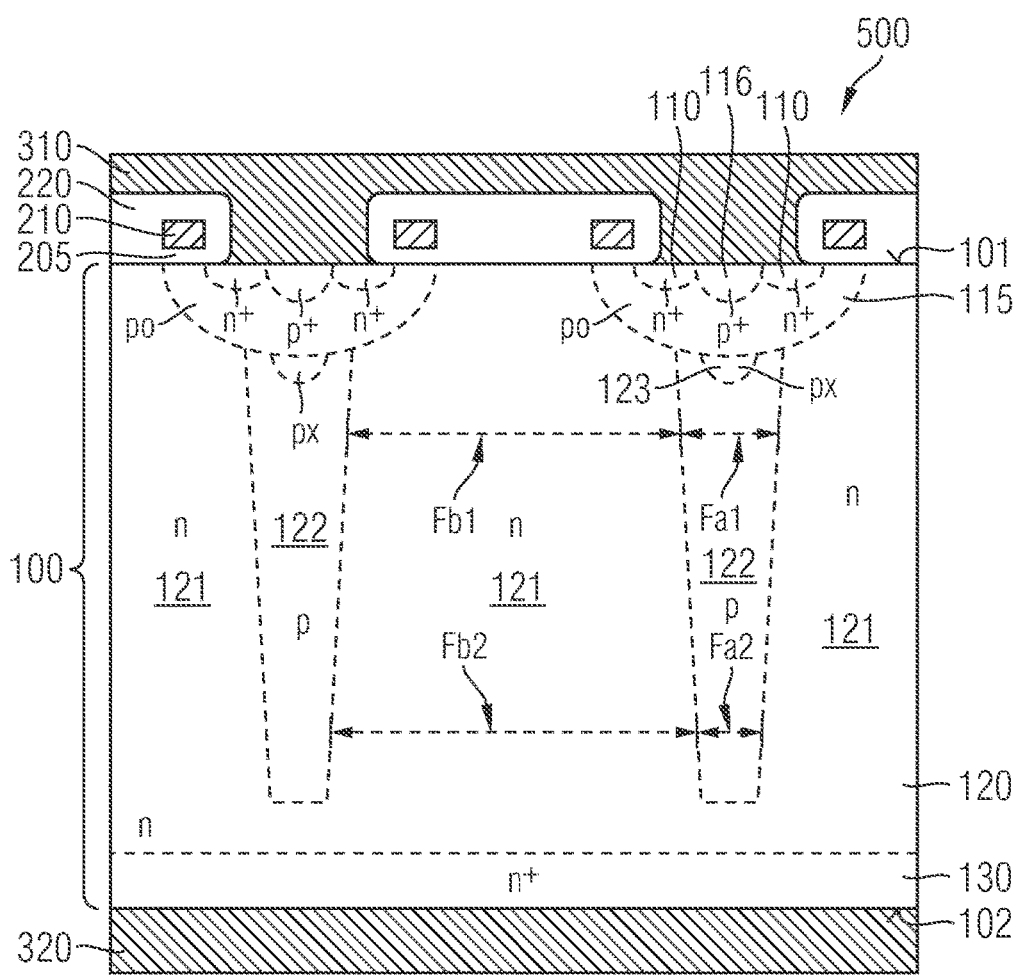
FIG. 2C is a schematic cross-sectional view of a portion of a super junction semiconductor device in accordance with an embodiment providing p-doped extension zones between body zones and tapered p-doped columns.

FIG. 2C refers to an embodiment providing tapered second columns 122 with a homogeneous impurity concentration p and inversely tapered first columns 121 with a homogenous impurity concentration n. The variation of the sign of a compensation rate is achieved by varying the lateral cross-sectional areas of the first and second columns 121, 122 along their vertical extension.

According to the illustrated embodiment, the lateral cross-sectional area Fa1 of the second columns 122 in a first section oriented to the first surface 101 is greater than the lateral cross-sectional area Fa2 of the second columns 122 in a second section oriented to the second surface 102. For the corresponding lateral cross-sectional areas Fb1 and Fb2 of the first columns 121, a cross-sectional area Fb1 taken at the same distance to the first surface 101 as Fa1 is smaller than the lateral cross-sectional area Fb2 taken at the same distance to the first surface 101 as Fa2. The differences in the cross-sectional areas are selected such that Fa1×p exceeds Fb1×n and Fa2×p is lower than Fb2×n. The sign of the compensation rate is positive in the section oriented to the first surface 101 and negative in the section oriented to the second surface 102.

According to an embodiment, a cross-sectional area at the upper end of the second column 122 oriented to the first surface 101 exceeds a mean cross-sectional area by at least 10% and by at most 100% and a cross sectional area at the end oriented to the second surface 102 is smaller than the mean cross-sectional area by at least 10% and by at most 100%.

Figure 3A:
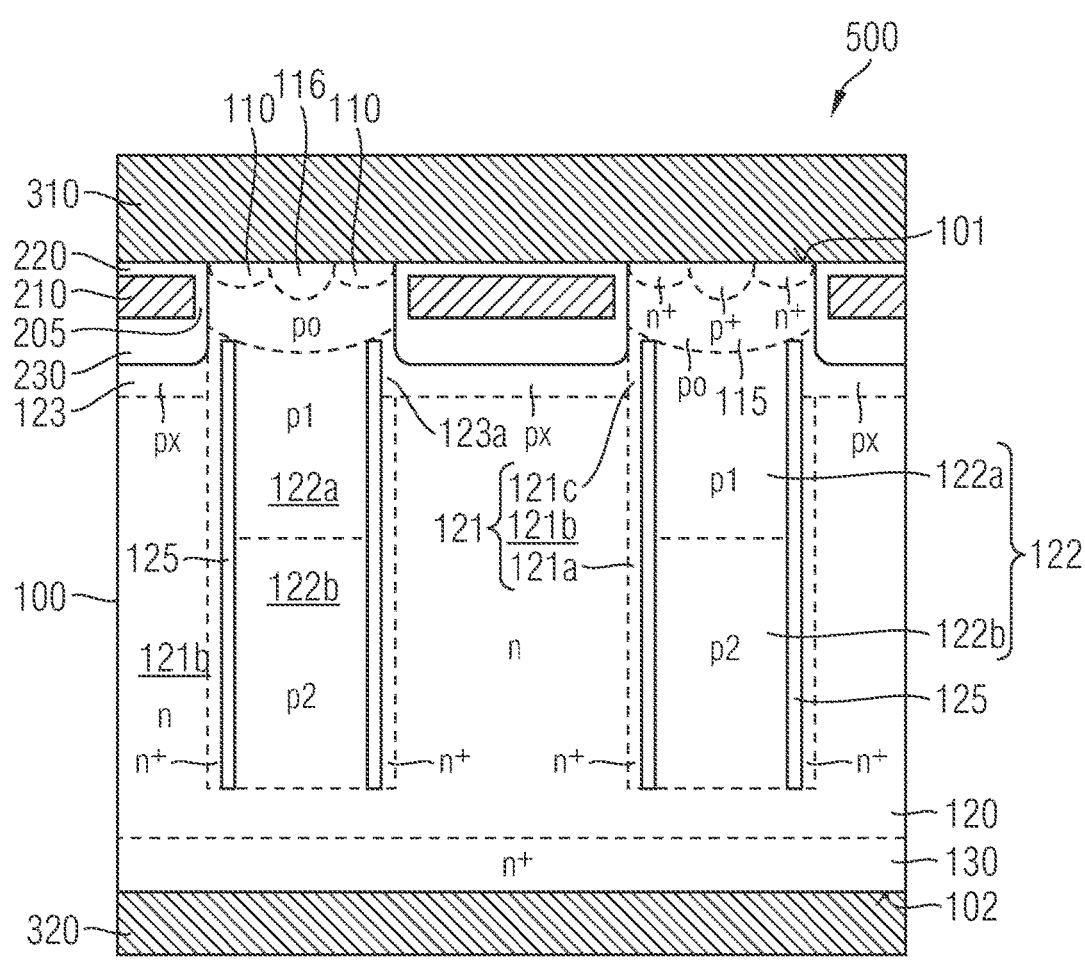
FIG. 3A is a schematic cross-sectional view of a portion of a super junction semiconductor device in accordance with an embodiment providing buried gate electrodes and p-doped field extension zones in the vertical projection of n-doped columns.
Figure 3B:
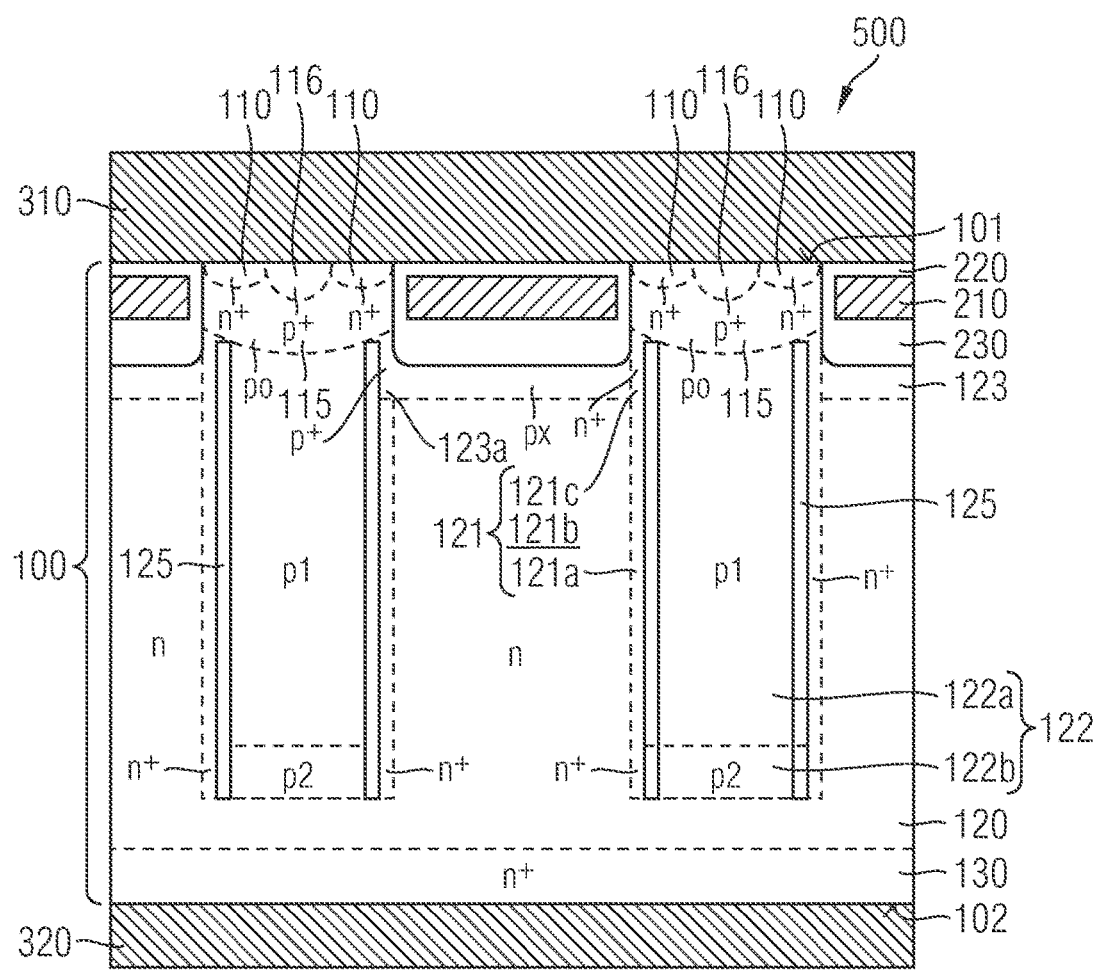
FIG. 3B is a schematic cross-sectional view of a portion of a super junction semiconductor device in accordance with another embodiment providing buried gate electrodes and p-doped field extension zones in a vertical projection of p-doped columns.
Figure 3C:
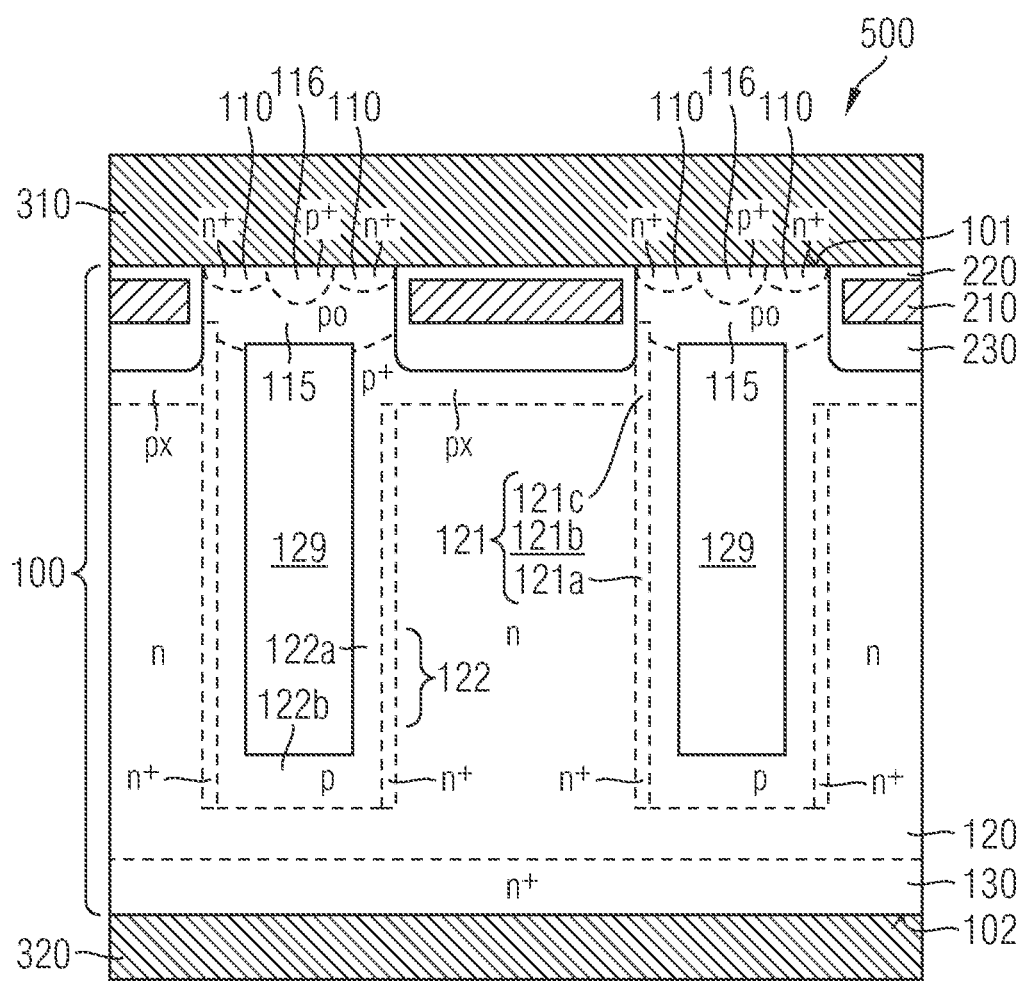
FIG. 3C is a schematic cross-sectional view of a portion of a super junction semiconductor device in accordance with a further embodiment providing buried gate electrodes and p-doped field extension zones in a projection of p-doped columns.

The embodiments of FIGS. 3A to 3C provide field extension zones 123 of the second conductivity type arranged in the vertical projection of the first columns 121 of the first conductivity type. The field extension zones 123 are arranged between the first columns 121 and the first surface 101. Connecting zones 123a electrically connect each field extension zone 123 with one of the body zones 115.

Field extension zones 123 of the second conductivity type arranged in the vertical projection of the first columns 121 of the first conductivity type may be combined with planar gate electrodes 210 as illustrated in FIG. 1A and in FIGS. 2A to 2C. For example, the field extension zones 123 may be bubbles extending from the first surface 101 into the drift layer 120, wherein the bubbles are separated from the neighboring body zones 115.

FIGS. 3A to 3C combine field extension zones 123 of the second conductivity type in the vertical projection of the first columns 121 of the first conductivity type with trench gate approaches. The gate electrodes 210 are provided in trenches extending above the first columns 121 from the first surface 101 into the semiconductor portion 100. A buried dielectric 230 insulates the respective gate electrode 210 from the drift layer 120. The gate dielectrics 205 extend in the vertical direction between the gate electrodes 210 and the body zones 115, which are formed between the gate trenches. The second columns 122 may be provided in super junction trenches with vertical sidewalls extending perpendicular to the first surface 101. A dielectric liner 125 between the first and second columns 121, 122 may line the vertical sidewalls of the super junction trenches and may separate the first and second columns 121, 122.

In a first section 122a of the second columns 122, which may be provided in the super junction trenches, the impurity concentration may be higher than in a second section 122b oriented to the second surface 102. The first columns 121 may include a heavily doped first portion 121a formed along the sidewalls of the second columns 122 and a second, lightly doped portion 121b in the rest. The heavily first portions 121a may be formed by an ion beam implant or by outdiffusion through the sidewalls of the super junction trenches or by depositing a conformal n-doped layer before providing the second columns 122.

The field extension zones 123 are formed between the buried dielectric 230 and the lightly doped second portions 121b of the first columns 121. Connection zones 123a structurally and electrically connect the field extension zones 123 with the body zones 115. The connection zones 123a are provided in the vertical projection of first sections of the heavily doped first portions 121a of the first columns 121 oriented to the second surface 102. In a direction vertical to the cross-sectional plane, connection zones 123a and second sections 121c of the heavily doped first portions 121a alternate such that the first columns 121 and the field extension zones 123 are alternatingly connected to the respective body zones 115. The second sections 121c of the heavily doped first portions 121a connect the first columns 121 with a channel portion of the body zone 115 where a conductive channel is formed in an on-state of the device 500.

In FIGS. 3B and 3C the impurity distribution changes such that more impurities of the second conductivity type per vertical dimension unit are provided in the second section 122b than in the first section 122a of the second columns 122. The second sections 122b extend over significantly less than a half of the vertical extension of the second columns 122 and have a higher dopant concentration than the first sections 122a. In addition, the field extension zones 123 of FIGS. 3B and 3C extend deeper into the semiconductor portion 100 and have a lower dopant concentration than the field extension zones 123 in FIG. 3A.

The second columns 122 of FIG. 3C include a first section 122a arranged along the vertical interfaces to the first columns 121, wherein the first sections 122a do not fill the corresponding portion of the super junction trenches completely. The second sections 122b correspond to completely filled lower portions of the super junction trenches. The first and second portions 122a, 122b may be formed by conformally depositing a semiconductor layer in the super junction trenches and then converting the deposited, for example polycrystalline, semiconductor material into a single crystalline semiconductor material. Fill structures 129 may separate the vertical sections of the first sections 122a. The fill structures 129 may be voids filled with ambient atmosphere or a dielectric structure including, for example an oxide, e.g. a silicon oxide. According to other embodiments, the fill structures 129 may contain lightly doped silicon. The quantity of impurities of the second conductivity type in a first section 122a is higher than the quantity of impurities in a second section 122b.

Figure 4A:
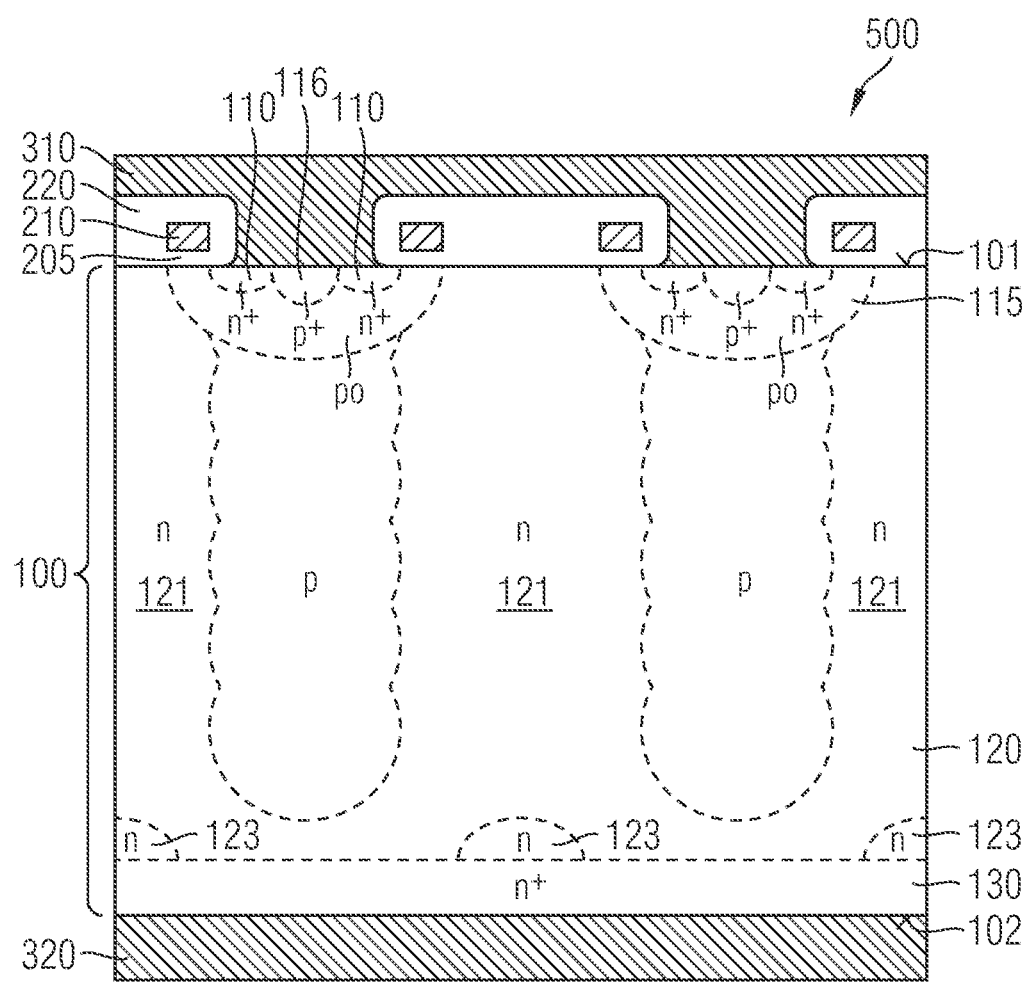
FIG. 4A is a schematic cross-sectional view of a portion of a semiconductor device in accordance with an embodiment providing a super junction structure based on sub-layers grown by epitaxy and n-doped field extension zones in the projection of n-doped columns.

FIG. 4A generally corresponds to FIG. 2B. Alternatively or in addition to the field stop zones 123 of the second conductivity type in the vertical projection of the second columns 122, the embodiment of FIG. 4A includes spatially separated field extension zones 123 of the first conductivity type arranged in the vertical projection of the first columns 121 along the interface between the drift layer 120 and the impurity layer 130. The field extension zones 123 may be bubbles having a maximum vertical extension in a lateral center of the first columns 121. The field extension zones 123 may be absent in the vertical projection of the second columns 122.

Figure 4B:
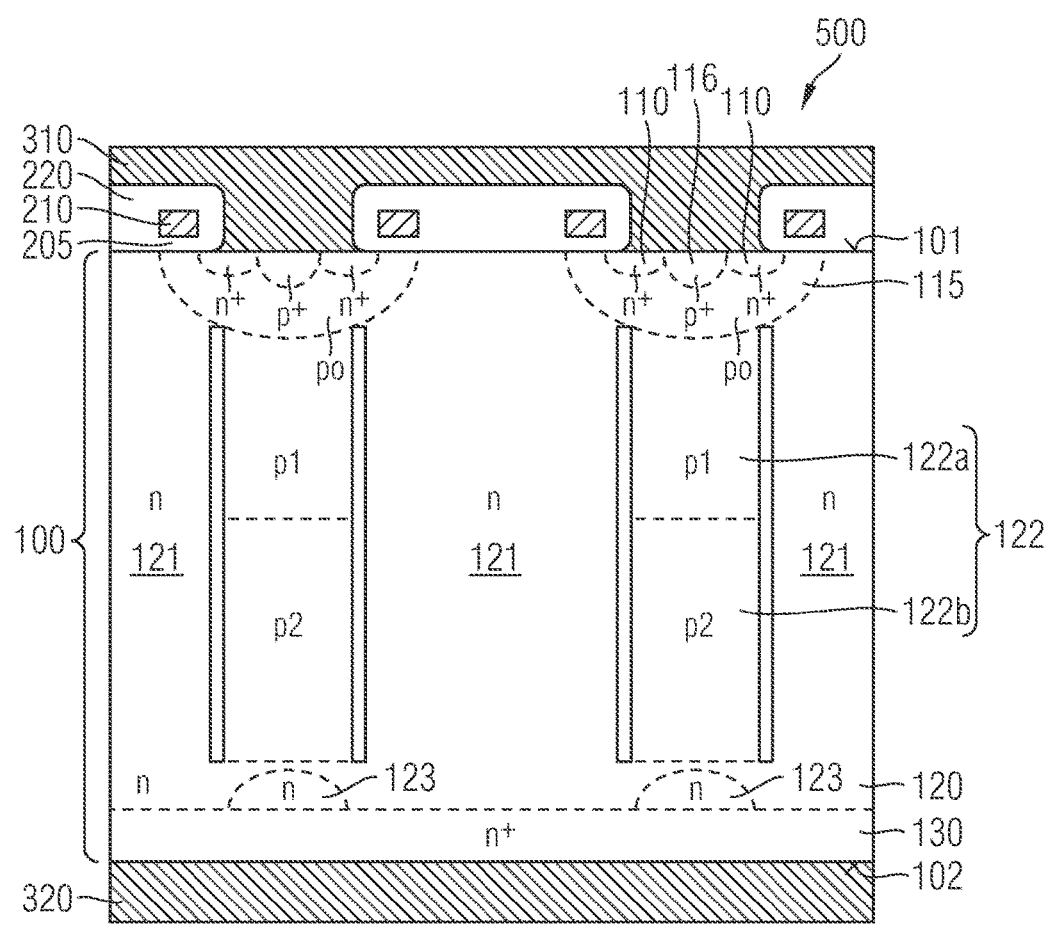
FIG. 4B is a schematic cross-sectional view of a portion of a semiconductor device in accordance with an embodiment providing a super junction structure including a dielectric liner and segments of an n-doped field extension zone in the projection of p-doped columns.

The semiconductor device 500 of FIG. 4B generally corresponds to the semiconductor device 500 of FIG. 2A. Alternatively or in addition to the field extension zones 123 of the first conductivity type assigned to the second columns 122, the semiconductor device 500 of FIG. 4B includes field extension zones 123 arranged in the vertical projection of the second columns 122 along the interface to the impurity layer 130. Each field extension zone 123 may be formed by an implant the second surface 102 and may have a "bubble"-shape with a maximum vertical extension in the lateral center of the second columns 122. According to other embodiments, the field extension zones 123 may have an approximately rectangular shape with interfaces to the drift layer 120 or the second columns 122, which are parallel to the second surface 102 and approximately planar. The field extension zones 123 may be absent in the vertical projection of the first columns 121.

The semiconductor device 500 of FIG. 4C differs from the semiconductor device 500 of FIG. 2C in a continuous field extension zone 123 with an interface to the drift layer 120 which is parallel to the interface between the field extension zone 123 and the impurity layer 130.

Figure 4D:
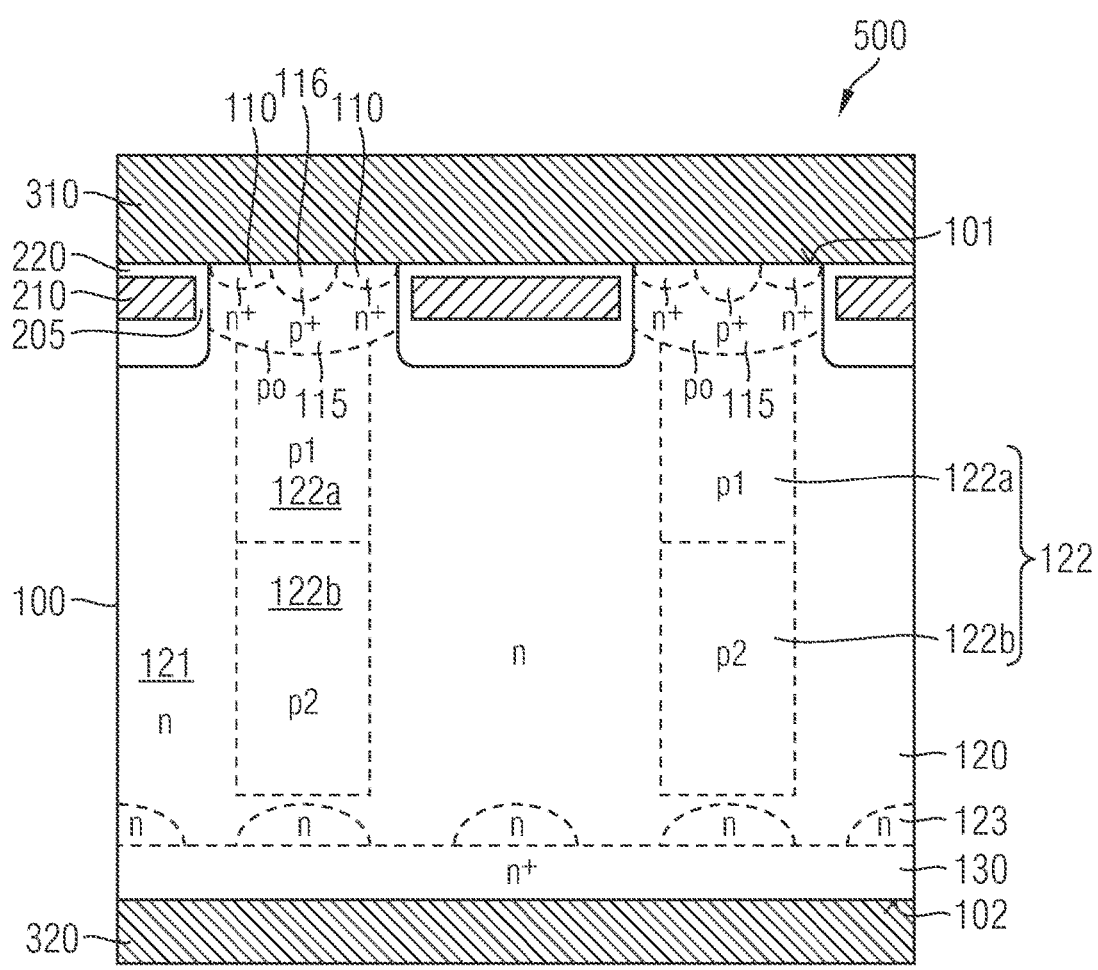
FIG. 4D is a schematic cross-sectional view of a portion of a semiconductor device in accordance with an embodiment providing spatially separated segments of a field stop extension zone in the vertical projection of p- and n-doped columns.

The semiconductor device 500 of FIG. 4D refers to an embodiment with the gate electrodes 210 provided in gate trenches, as in FIGS. 3A to 3C, and with spatially separated field extension zones 123. The field extension zones 123 are separated from each other and are arranged in the vertical projection of both the first and the second columns 121, 122. The field extension zones 123 may be formed as bubbles having a maximum vertical extension in the lateral center of the first and second columns 121, 122.

Figure 4E:
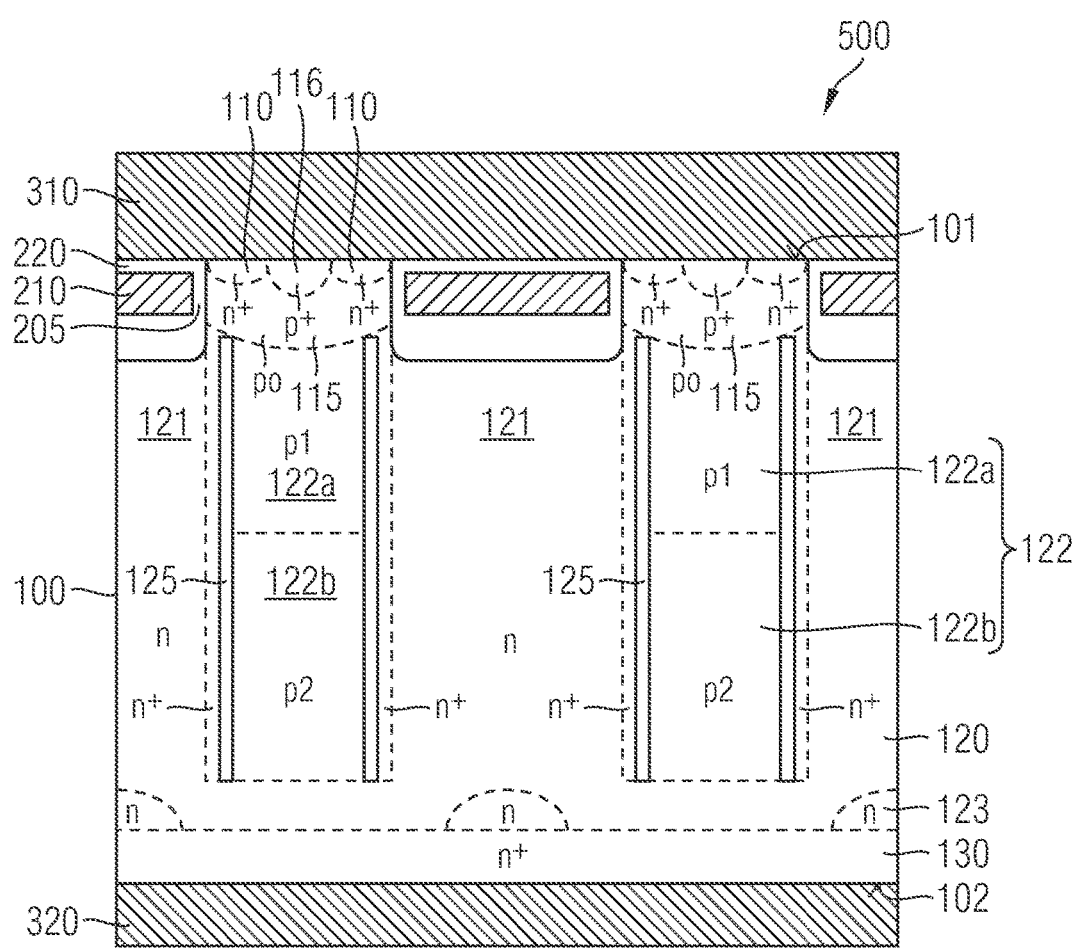
FIG. 4E is a schematic cross-sectional view of a portion of a semiconductor device in accordance with an embodiment providing a super junction structure including a dielectric liner, buried gate electrodes, and segments of an n-doped field extension zone in the projection of n-doped columns.

FIG. 4E shows an embodiment similar to the semiconductor device 500 of FIG. 3A without field extension zones 123 of the second conductivity type but with spatially separated field extension zones 123 of the first conductivity type, wherein each field extension zone 123 is arranged along the interface to the impurity layer 130 in the vertical projection of one of the first columns 121.

Figure 4F:
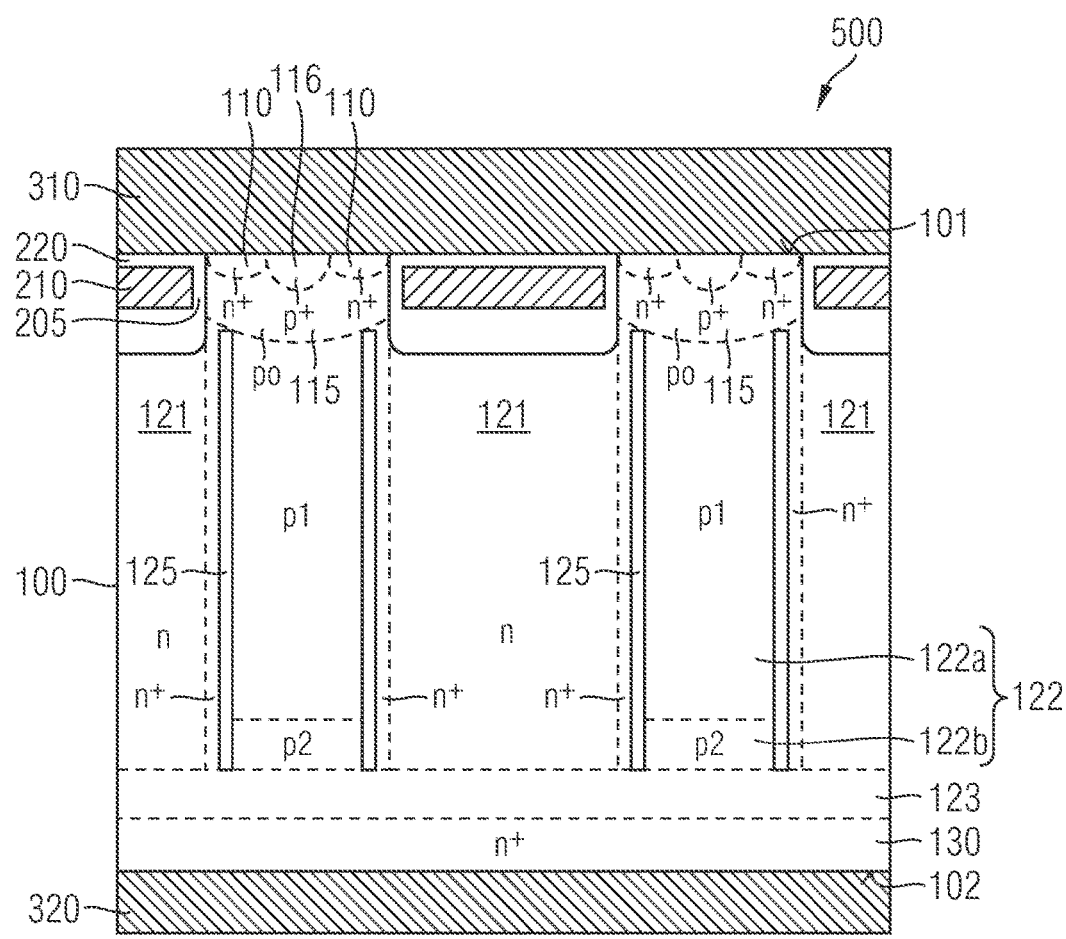
FIG. 4F is a schematic cross-sectional view of a portion of a super junction semiconductor device in accordance with an embodiment providing a super junction structure including a dielectric liner, buried gate electrodes, and a contiguous n-doped field extension zone.

The semiconductor device 500 of FIG. 4F corresponds to the semiconductor device 500 of FIG. 3B and further includes a continuous field extension zone 123 of the first conductivity type parallel and directly adjoining to the impurity layer 130. The field extension zone 123 may completely fill the space between the second columns 122 and the impurity layer 130. Other embodiments may provide the field stop zone 123 separated from the second columns 122 or the second columns 122 protruding into the field stop zone 123.

Figure 4G:
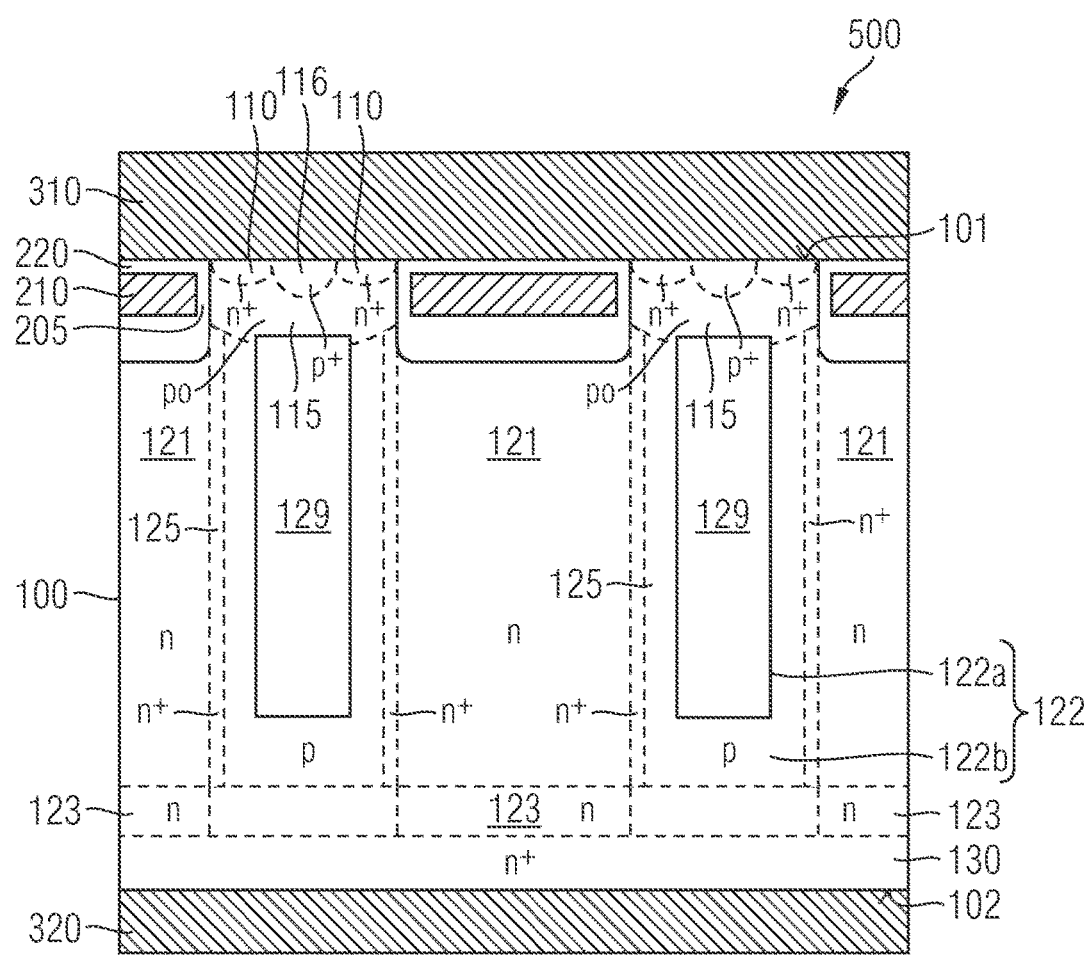
FIG. 4G is a schematic cross-sectional view of a portion of a super junction semiconductor device in accordance with an embodiment providing buried gate electrodes and segments of an n-doped field stop extension zone in the vertical projection of the n-doped columns.

The semiconductor device 500 of FIG. 4G corresponds to the semiconductor device 500 of FIG. 3C. Instead of or in addition to the field extension zones 123 of the second conductivity type, the semiconductor device 500 of FIG. 4G includes spatially separated field stop zones 123 of the first conductivity type at least in the vertical projection of the first columns 121. The field stop extension zones 123 may have planar interfaces to the drift layer 120 parallel to the impurity layer 130.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
an impurity layer of a first conductivity type formed in a semiconductor portion having a first surface and a second surface parallel to the first surface;
a super junction structure between the first surface and the impurity layer, the super junction structure comprising first columns of the first conductivity type and second columns of a second, opposite conductivity type, wherein a sign of a compensation rate between the first and second columns changes along a vertical extension of the columns perpendicular to the first surface;
a body zone of the second conductivity type formed between the first surface and one of the second columns at least partially in the vertical projection of the second columns; and
a field extension zone of the second conductivity type electrically connected to the body zone and arranged in the vertical projection of one of the first or the second columns,
wherein an area impurity density in the field extension zone is between $1\times10^{12}$ and $5\times10^{12}$ cm$^{-2}$,
wherein a mean net impurity concentration in the field extension zone is higher than in the second columns and lower than in the body zone.

2. The super junction semiconductor device of claim 1, wherein the field extension zone is arranged along the vertical axis of one of the second columns and is absent along the vertical axes of any of the first columns.

3. The super junction semiconductor device of claim 1, wherein the field extension zone is arranged along the vertical axis of one of the first columns and is absent along the vertical axes of any of the second columns.

4. The super junction semiconductor device of claim 1, wherein a first section of the super junction structure oriented to the first surface has an excess of impurities of the second conductivity type and a second section oriented to the second surface has an excess of impurities of the first conductivity type.

5. The super junction semiconductor device of claim 4, wherein the first section extends over at least a third and at most two third of the vertical extension of the second column and the second section extends over a remaining section of the second column.

6. The super junction semiconductor device of claim 5, wherein:
in the first section, a quantity of impurities of the second conductivity type in a vertical extension unit exceeds a quantity of impurities of the first conductivity type in the vertical extension unit by at least 10%; and in the second section, a quantity of impurities of the first conductivity type in a vertical extension unit exceeds a quantity of impurities of the second conductivity type in the vertical extension unit by at least 10%.

7. The super junction semiconductor device of claim 2, wherein the first section extends over 40% to 60% of a vertical extension of the second columns and the second section extends over a remaining portion of the vertical extension of the second columns.

8. The super junction semiconductor device of claim 1, wherein the field extension zone extends from an interface between the body zone and the corresponding second column into the second column.

9. The super junction semiconductor device of claim 8, wherein the field extension zone is formed in a central portion of the corresponding second column and is spaced from neighboring first columns.

10. The super junction semiconductor device of claim 8, wherein a maximum impurity concentration in the field extension zone is at least two times a maximum impurity concentration in an adjoining portion of the second column and a maximum impurity concentration in the body zone is at least two times the maximum impurity concentration in the field extension zone.

11. The super junction semiconductor device of claim 1, wherein the field extension zone is provided between the first surface and one of the first columns.

12. The super junction semiconductor device of claim 11, further comprising a connecting zone of the second conductivity type electrically connecting the field extension zone and the body zone.

13. The super junction semiconductor device of claim 11, further comprising a buried gate electrode provided in a trench extending from the first surface into the semiconductor portion in the vertical extension of one of the first columns.

14. The super junction semiconductor device of claim 11, wherein the first columns comprise a heavily doped portion oriented to the second columns and a lightly doped portion spaced from the first columns by the heavily doped portion, respectively.

15. The super junction semiconductor device of claim 11, further comprising dielectric liners between the first and second columns.

16. The super junction semiconductor device of claim 14, wherein:
   the field extension zone is provided between the first surface and one of the first columns; and
   a connecting zone of the second conductivity type electrically connects the field extension zone and the body zone in a vertical projection of a first section of the heavily doped portion.

17. The super junction semiconductor device of claim 16, wherein a plurality of connecting zones alternate with second sections of the heavily doped portions in a lateral direction parallel to the first surface, the second sections of the heavily doped portions structurally connecting the first columns with a channel portion of the body zone where a conductive channel is formed in an on-state of the device.

18. The super junction semiconductor device of claim 17, wherein the channel portion directly adjoins a gate dielectric provided between the body zone and a gate electrode.

19. The super junction semiconductor device of claim 1, wherein a vertical extension of the field extension zone is at least 2 μm.

20. The super junction semiconductor device of claim 1, wherein a mean net impurity concentration in the field extension zone is at most $10^{16}$ cm$^{-3}$.

21. The super junction semiconductor device of claim 1, wherein the body zone comprises a heavily doped contact zone suitable for forming a low-ohmic contact with a first electrode structure directly adjoining the contact zone.

* * * * *

UNITED STATES PATENT AND TRADEMARK OFFICE
CERTIFICATE OF CORRECTION

PATENT NO. : 9,825,127 B2
APPLICATION NO. : 15/088914
DATED : November 21, 2017
INVENTOR(S) : A. Willmeroth et al.

Page 1 of 1

It is certified that error appears in the above-identified patent and that said Letters Patent is hereby corrected as shown below:

In the Claims

Column 12, Line 61 (Claim 5, Line 3) please change "two third" to -- two thirds --

Signed and Sealed this
Twenty-second Day of May, 2018

Andrei Iancu
*Director of the United States Patent and Trademark Office*